(12) United States Patent
Koch (10) Patent No.: US 7,928,886 B2
(45) Date of Patent: Apr. 19, 2011

(54) EMULATION OF ANALOG-TO-DIGITAL CONVERTER CHARACTERISTICS

(75) Inventor: Rudolf Koch, Oberhaching (DE)

(73) Assignee: Infineon Technologies AG, Neubiberg (DE)

(*) Notice: Subject to any disclaimer, the term of this patent is extended or adjusted under 35 U.S.C. 154(b) by 7 days.

(21) Appl. No.: 12/496,265

(22) Filed: Jul. 1, 2009

(65) Prior Publication Data

US 2011/0001646 A1 Jan. 6, 2011

(51) Int. Cl.
*H03M 1/12* (2006.01)

(52) U.S. Cl. .............. 341/155; 341/118; 381/71.14; 374/170

(58) Field of Classification Search .......... 341/155, 341/143, 118; 374/170; 381/71.14, 71.6, 381/312

See application file for complete search history.

(56) References Cited

U.S. PATENT DOCUMENTS

| | | | | |
|---|---|---|---|---|
| 5,675,334 A * | 10/1997 | McCartney | .................. | 341/118 |
| 5,760,617 A * | 6/1998 | Coln et al. | .................. | 327/101 |
| 6,975,258 B2 * | 12/2005 | Pedersen | .................. | 341/143 |
| 7,142,144 B1 * | 11/2006 | Farooqi et al. | .................. | 341/143 |
| 7,433,481 B2 * | 10/2008 | Armstrong et al. | .......... | 381/312 |
| 2003/0169193 A1 * | 9/2003 | LeReverend et al. | ......... | 341/143 |
| 2004/0004994 A1 * | 1/2004 | Wu et al. | .................. | 374/170 |
| 2004/0178938 A1 * | 9/2004 | Pedersen | .................. | 341/143 |
| 2008/0107282 A1 * | 5/2008 | Asada | .................. | 381/71.14 |
| 2008/0310645 A1 * | 12/2008 | Itabashi et al. | ............... | 381/71.6 |

* cited by examiner

*Primary Examiner* — Jean B Jeanglaude
(74) *Attorney, Agent, or Firm* — SpryIP, LLC

(57) ABSTRACT

Described herein is a system and method of emulating characteristics of an output signal of a first analog-to-digital converter by a second analog-to-digital converter employing signal processing. A signal processing module may receive a digital signal from the first analog-to-digital converter and alter the digital signal to define an altered digital signal such that the altered digital signal emulates a second digital signal that is characteristic of the second analog-to-digital converter, the second analog-to-digital converter differing from the first analog-to-digital converter.

24 Claims, 6 Drawing Sheets

EMULATION OF ANALOG-TO-DIGITAL CONVERTER CHARACTERISTICS

BACKGROUND

Today nearly every data acquisition or communications system relies on digital signal processing e.g. to improve signal quality, data rate, to compensate analog impairments etc. Analog-to-digital converters are employed to convert the original analog or quasi-analog signal into bits. One example of such a system is the so-called digital microphone. Digital microphones in mobile communication devices offer many advantages over analog microphones. Problems associated with analog devices such as hum noise and ground loops may be avoided with digital microphones. Further, the digital microphone may be placed anywhere, i.e. an automobile, and avoid all problems typically associated with an analog microphone.

The output of the digital microphone (or any other source) may be input to other processing blocks of, e.g. a mobile communication device. The desired output of the digital microphone may be driven by various outside influences such as legacy issues or customer specifications such that the other processing blocks may utilize the output signal. The desired output of the digital microphone is typically tied to a specific structure of processing modules within the digital microphone, i.e. specific structures of analog-to-digital converters.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

The present application describes a system and a method for emulating analog-to-digital converter characteristics. Many specific details are set forth in the following description and in FIGS. 1-5 to provide a thorough understanding of various implementations. One skilled in the art will understand, however, that the subject matter described herein may have additional implementations, or that the concepts set forth may be practiced without several of the details described in the following description. More specifically, the characteristics of an output signal of a certain first analog-to-digital converter is emulated by a system comprising a second analog-to-digital converter—which may be advantageous compared to the first ADC for certain reasons—and subsequent signal processing.

Signal to be Emulated

Figure 1:
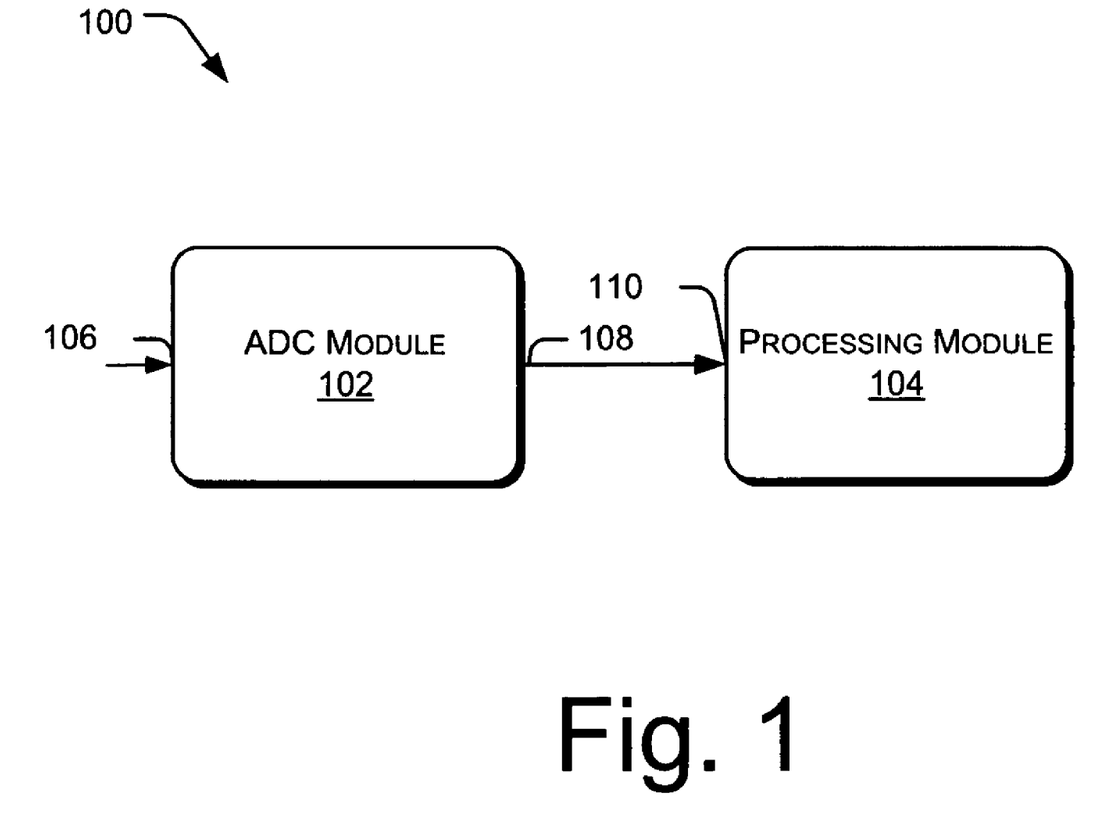
FIG. 1 is a block diagram of a system comprising a first analog to digital converter and a processing module in the state of the art.

FIG. 1 shows a system 100 comprising an analog to digital converter (ADC) 102 and a processing module 104. System 100 may be employed in a mobile communications device, a hands free mobile communication device, a hearing aid device, etc.

ADC module 102 is configured to receive an analog signal $S_1$ via an input terminal 106. In an implementation, signal $S_1$ may be an input signal from a microphone (not shown) employed in a mobile communications device (not shown). However, signal $S_1$ may be a signal from any of various signal generation sources including, but not limited to, a sensor, an antenna, etc. ADC module 102 converts signal $S_1$ from the analog domain to the digital domain and outputs digital signal $S_2$ at output terminal 108. Signal $S_1$ is converted to signal $S_2$ such that processing module 104 may perform various functions thereon dependent upon the application desired.

ADC module 102 produces signal $S_2$ having specific characteristics that may be desired by processing module 104, the specific characteristics being associated with ADC module 102. To that end, ADC module 102 may be implemented from any of various ADC structures. Examples of such ADC structures include, but are not limited to, direct conversion ADC, successive approximation ADC, ramp-compare ADC, Wilkinson ADC, integrating ADC, delta-encoded ADC, pipeline ADC, sigma-delta ADC, and time interleaved ADC. To that end, the differing ADC structures of ADC module 102 may produce differing output signals having differing characteristics. The ADC structure of ADC module 102 is chosen such that signal $S_2$ has certain characteristics that are desirable to processing module 104. Further, processing module 104 is chosen such that it optimally fits to ADC module 102. In a specific implementation, signal $S_2$ corresponds to a $4^{th}$ order single bit Sigma-Delta ADC structure of ADC module 102.

Processing module 104 is constructed, configured or programmed to receive and process signal $S_2$ from ADC module 102. An input terminal 110 of processing module 104 is connected to output terminal 108 of ADC module 102. Processing module 104 may perform any of various signal processing functions on signal $S_2$ depending upon the application desired. Examples of signal processing functions that processing module 104 may employ include, but is not limited to, filtering, amplification, attenuation, frequency conversion, averaging, peak detection. To that end, for processing module 104 to function as desired, processing module 104 may only accept signal $S_2$ input thereto because signal $S_2$ has the aforementioned characteristics. The various characteristics may include, among other things, sampling rate, linearity, dynamic range, overload recovery, coding. In a further implementation, processing module 104 may only accept signal $S_2$ input thereto due to legacy issues, interface specifications or requirements, or customer specifications.

To that end, as mentioned above, the specific ADC structure of ADC module 102 is chosen such that signal $S_2$ has the desirable characteristics associated therewith, with the desired characteristics being associated with ADC module 102. However, employing ADC module 102 within system 100 to output signal $S_2$ having the desirable characteristics may have drawbacks associated therewith. More specifically, ADC module 102 (and the specific ADC structure thereof) may not be optimized for other characteristics, including, but not limited to, resolution, bandwidth, power consumption, and area consumption or may not be suitable for the given process technology, supply voltage or other constraints. To that end, it may be desired to provide a differing ADC structure of ADC module 102 while still producing signal $S_2$ having the characteristics desired by processing module 104 and associated with the first ADC structure.

To produce signal $S_2$ that is typically associated with ADC module 102 while employing a differing ADC structure of ADC module 102, signal $S_2$ may be emulated employing a differing ADC module within a digital signal processing chain, described further below. The emulated signal may differ from the original signal in not critical properties or be of better quality in the same or other properties as long as it can be processed by the same digital processing module as the original signal $S_2$.

First Implementation of Emulating a Signal

Figure 2:
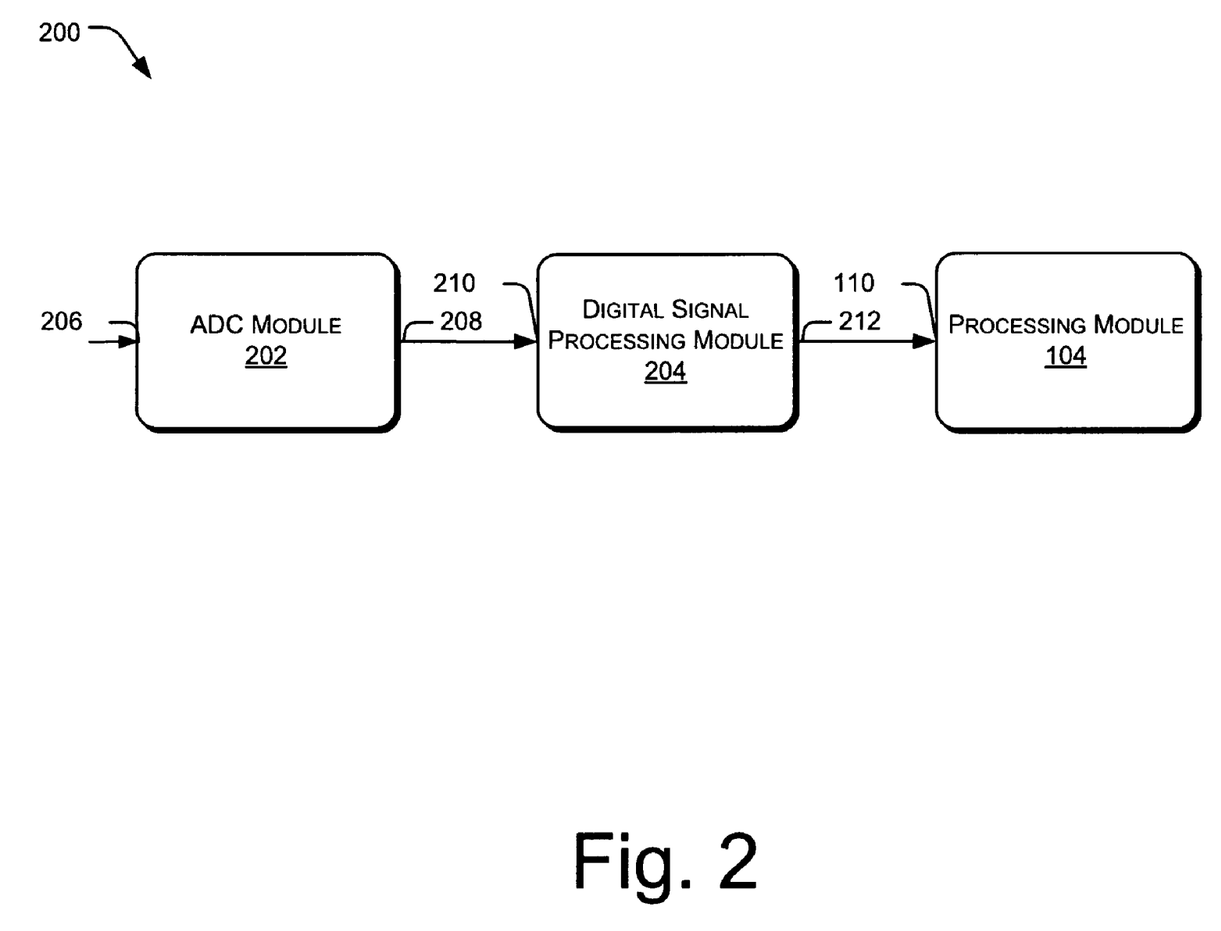
FIG. 2 is a block diagram of a system for emulating characteristics of a signal, in a first embodiment.

FIG. 2 shows an overview of a system 200 for emulating signal $S_2$. System 200 comprises an ADC module 202, a digital signal processing module 204, and processing module 104 of FIG. 1. System 200 processes a signal such that after processing, the signal emulates a signal that is typical of a differing signal processing system, more specifically of a system based on a different type or implementation of an analog-to-digital converter as described further below.

ADC module 202 is configured to receive an analog signal $S_3$ via an input terminal 206. Signal $S_3$ may be substantially the same as signal $S_1$ mentioned above with respect to FIG. 1, however, in a further implementation, signal $S_3$ differs from signal $S_1$. ADC module 202 converts signal $S_3$ from the analog domain to the digital domain and outputs digital signal $S_4$ at output terminal 208.

ADC module 202 may be advantageous to employ as compared to ADC module 102. More specifically, ADC module 202 may offer improved resolution, bandwidth, power consumption, and area consumption as compared to ADC module 102 or may be better suited for the given process technology, supply voltage or other constraint. Further, ADC module 202 differs in structure from ADC module 102, and thus signal $S_4$ differs from signal $S_2$. More specifically, the characteristics of signal $S_4$ differ from the characteristics of signal $S_2$. However, as mentioned above, for processing module 104 to function as desired, processing module 104 may only accept signal $S_2$ input thereto because signal $S_2$ has the aforementioned characteristics associated with ADC module 102. For processing module 104 to accept signal $S_4$, signal $S_4$ is altered to emulate signal $S_2$. In an implementation, signal $S_4$ has n number of bits.

Digital signal processing module 204 is configured to receive signal $S_4$ from ADC module 202. An input terminal 210 of digital signal processing module 204 is connected to output terminal 208 of ADC module 202. Digital signal processing module 204 performs various digital signal processing techniques on signal $S_4$ and outputs a signal $S_5$ at output terminal 212. In an implementation, signal $S_5$ has m number of bits.

Signal $S_5$ may be substantially the same as signal $S_2$ in that the characteristics of signal $S_5$ are substantially the same as the characteristics of signal $S_2$. To have the characteristics of signal $S_5$ to be substantially the same as the characteristics of signal $S_2$ of ADC module 102, digital signal processing module 204 modifies and/or alters signal $S_4$. More specifically, signal $S_4$ output by ADC module 202 is modified by digital signal processing module 204 by employing such techniques including, but not limited to, filtering, re-quantizing, data rate conversion, code change of signal $S_4$ such that output signal $S_5$ has substantially the same characteristics of signal $S_2$ of ADC module 102, i.e. signal $S_5$ emulates signal $S_2$.

In a specific implementation, digital signal processing module 204 alters the bit number of signal $S_4$ such that signal $S_5$ has the desired characteristics to emulate signal $S_2$. More specifically, digital signal processing module 204 may e.g. increase the bit number of signal $S_4$, i.e. m>n; or digital signal processing module 204 may decrease the bit number of signal $S_4$, i.e. m<n. In a further implementation, digital signal processing module 204 may alter and/or maintain the bit number of signal $S_4$ such that the bit number of signal $S_4$ equals the bit number of signal $S_5$, i.e. m=n.

Analogous as that mentioned above with respect to FIG. 1, processing module 104 is configured to receive signal $S_5$ from digital processing module 204. Input terminal 110 of processing module 104 is connected to output terminal 212 of digital signal processing module 104. To that end, processing module 104 may accept signal $S_5$ as though signal $S_5$ were signal $S_2$ as a result of signal $S_5$ having the same characteristics as the characteristics of signal $S_2$ and emulated as signal $S_2$. More specifically, signal $S_5$ appears to have been output by ADC module 102. From the perspective of processing module 104, processing module 104 cannot distinguish signal $S_5$ from signal $S_2$ in its essential properties, i.e. signal $S_5$ is substantially the same as signal $S_2$. Processing module 104 may perform any of various signal processing functions on signal $S_5$ depending upon the application desired.

Second Implementation of Emulating a Signal

Figure 3:
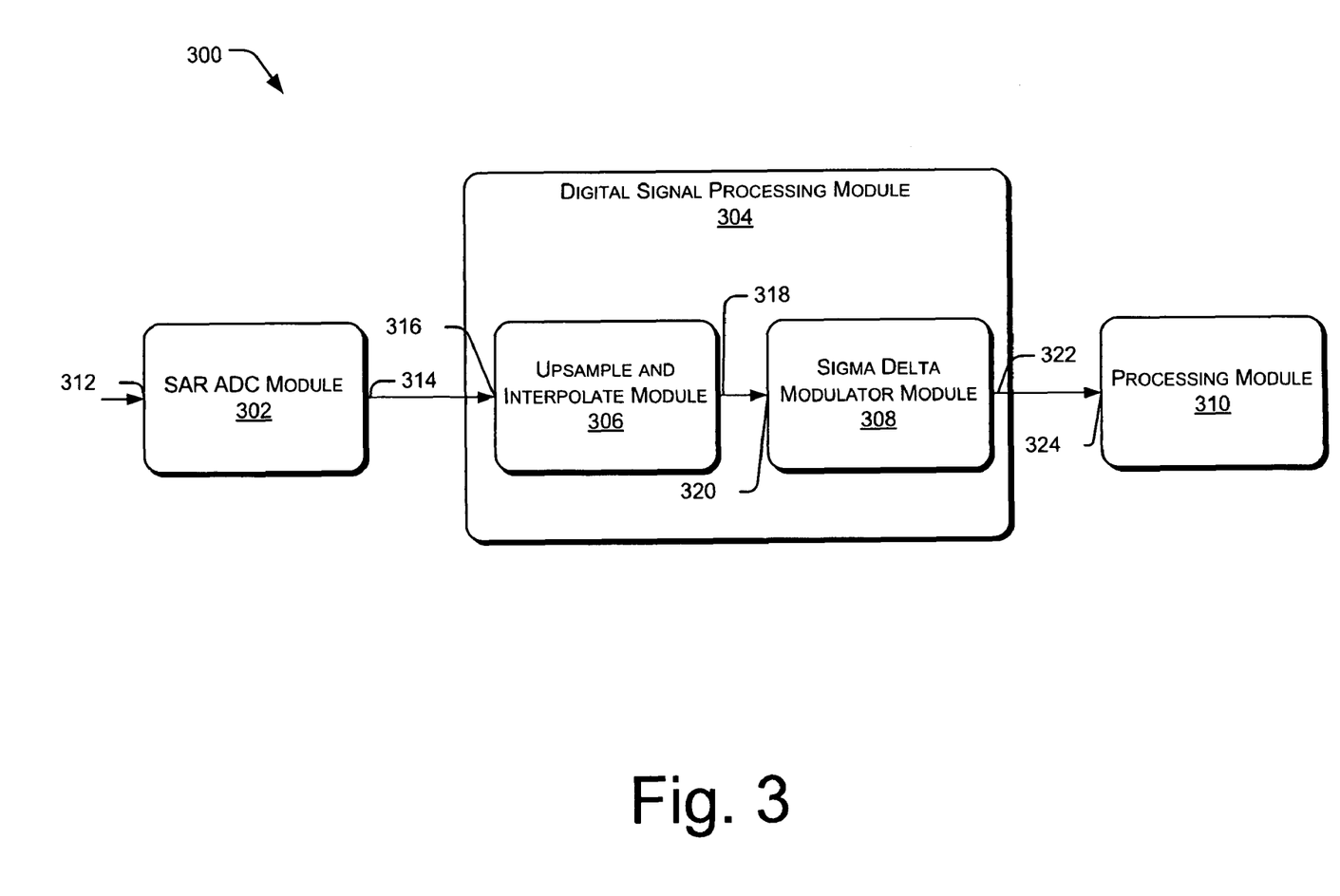
FIG. 3 is a block diagram of a system for emulating a signal, in a second embodiment.

FIG. 3 shows an overview of a system 300 that is a specific implementation of system 200 for emulation of a signal. More specifically, it is desired to have system 300 generate a signal that emulates a sigma delta ADC signal, in one special case of $4^{th}$ order with single bit internal quantization. System 300 comprises a successive-approximation-register (SAR) ADC module 302; a digital signal processing module 304 comprising an upsample and interpolate module 306 and a $4^{th}$ order digital sigma delta modulator 308; and a processing module 310.

SAR ADC module 302 is configured to receive an analog signal $S_6$ via an input terminal 312. In an implementation, signal $S_6$ may be a 20 kHZ analog signal input from a microphone (not shown) employed in a mobile phone (not shown). SAR ADC module 302 converts signal $S_6$ from the analog domain to the digital domain and outputs digital signal $S_7$ at output terminal 314, i.e. SAR ADC module 302 quantizes analog signal $S_6$ and outputs digital signal $S_7$. In an implementation, signal $S_7$ is a 120 kHZ digital 16 bit signal. Signal $S_6$ is converted to signal $S_7$ such that digital signal processing module 304 may perform various functions thereon.

Upsample and interpolate module 306 is configured to receive signal $S_7$ via an input terminal 316. Upsample and interpolate module 306 alters signal $S_7$ by increasing a frequency of signal $S_7$, e.g. by bit stuffing, and performs digital interpolation on signal $S_7$ e.g. using a sinc filter. Upsample and interpolate module 306 outputs signal $S_8$ at output terminal 318. In an implementation, signal $S_8$ is a 2.4 MHZ digital 16 bit signal.

$4^{th}$ order digital sigma delta modulator module 308 is configured to receive signal $S_8$ via an input terminal 320. Sigma delta modulator module 308 encodes signal $S_8$ into a signal with different code, typically with fewer bits, and outputs this as signal $S_9$ at output terminal 322. In an implementation, signal $S_9$ is a 2.4 MHZ digital 1 bit signal.

Processing module 310 is configured to receive signal $S_9$ from $4^{th}$ order digital sigma delta modulator module 308. Input terminal 324 of processing module 310 is connected to output terminal 322 of $4^{th}$ order digital sigma delta modulator module 308.

Processing module 310 may only accept a signal from a $4^{th}$ order sigma delta ADC structure. To that end, signal $S_9$ has characteristics that are substantially the same as a signal output from a $4^{th}$ order sigma delta ADC structure, i.e. the bit number and frequency of signal $S_9$ matches that of a signal output from a $4^{th}$ order sigma delta ADC structure. As a result, processing module 310 accepts signal $S_9$ as though signal $S_9$ were a signal output from a $4^{th}$ order sigma delta ADC structure as a result of signal $S_9$ having the same characteristics as the characteristics of a signal output from a $4^{th}$ order sigma delta ADC structure and emulated as a signal output from a $4^{th}$ order sigma delta ADC structure. More specifically, signal $S_9$ appears to have been output from a $4^{th}$ order sigma delta ADC structure. From the perspective of processing module 310, processing module 310 cannot distinguish signal $S_9$ from signal a signal output from a $4^{th}$ order sigma delta ADC structure, i.e. signal $S_9$ is substantially the same as a signal output from a $4^{th}$ order sigma delta ADC structure. Processing module 104 may perform any of various signal processing functions on signal $S_9$ depending upon the application desired.

Third Implementation of Emulating a Signal

Figure 4:
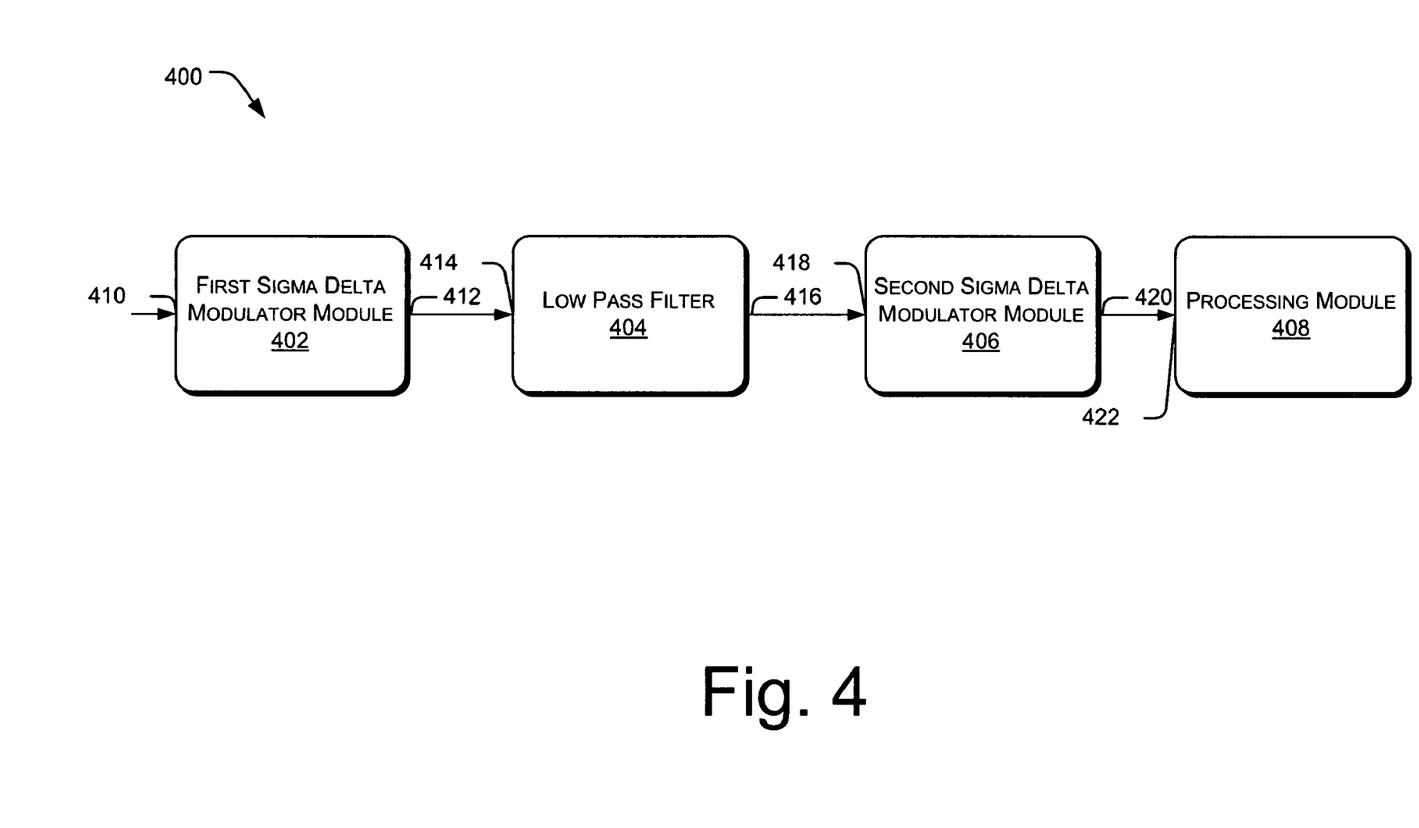
FIG. 4 is a block diagram of a system for emulating a signal, in a third embodiment.

FIG. 4 shows an overview of a system 400 that is a further specific implementation of system 200 for emulation of a signal. More specifically, it is desired to have system 400 generate a signal that emulates a $4^{th}$ order single bit sigma delta ADC signal to satisfy a proprietary interface specification. System 400 comprises a first $4^{th}$ order analog sigma delta modulator module 402 with internal multi-bit quantization, a low pass filter module 404, a second $4^{th}$ order single bit digital sigma delta modulator module 406, and a processing module 408.

Sigma delta modulator 402 is configured to receive a signal $S_{10}$ via an input terminal 410. In an implementation, signal $S_{10}$ may be an analog signal input from a microphone (not shown) employed in a mobile phone (not shown). Sigma delta modulator 402 encodes signal $S_{10}$ into a digital signal and outputs this signal as signal $S_{11}$ at output terminal 412. In an implementation, signal $S_{11}$ is a 2 bit signal. By using internal multi-bit quantization in modulator 402 it is possible to better overcome analog impairments and to achieve higher resolution than with an internal single bit quantizer.

Low pass filter module 404 is configured to receive signal $S_{11}$ via an input terminal 414. Low pass filter module 404 may filter and/or remove any quantized noise in signal $S_{11}$ from first sigma delta modulator module 402. This allows a majority of the dynamic range of second sigma delta modulator module 406 to be employed on the desired portion of signal $S_{11}$, which improves the dynamics of signal $S_{11}$. Low pass filter module 404 outputs a signal $S_{12}$ at output terminal 416. In an implementation, the word length of signal $S_{12}$ is wider than the word length of signal $S_{11}$.

Second sigma delta modulator module 406 is configured to receive signal $S_{12}$ via an input terminal 418. Second sigma delta modulator module 406 encodes signal $S_{12}$ into a signal coded differently than signal $S_{11}$ and outputs this signal as signal $S_{13}$ at output terminal 420. In implementation, $S_{13}$ has fewer bits than signal $S_{12}$ and signal $S_{11}$. In an implementation signal $S_{13}$ is a 1 bit signal.

Processing module 408 is configured to receive signal $S_{13}$ from second sigma delta modulator module 406. Input terminal 422 of processing module 408 is connected to output terminal 420 of second sigma delta modulator module 406.

Processing module 408 may only accept a signal from a $4^{th}$ order sigma delta ADC structure. To that end, signal $S_{13}$ has characteristics that are substantially the same as a signal output from a $4^{th}$ order single bit sigma delta ADC structure, i.e. the bit number and frequency of signal $S_{13}$ matches that of a signal output from a $4^{th}$ order single bit sigma delta ADC structure. As a result, processing module 408 accepts signal $S_{13}$ as though signal $S_{13}$ were a $4^{th}$ order sigma delta ADC structure as a result of signal $S_{13}$ having the same characteristics as the characteristics of a $4^{th}$ order sigma delta ADC structure and emulated as a $4^{th}$ order sigma delta ADC structure. More specifically, signal $S_{13}$ appears to have been output by a $4^{th}$ order sigma delta ADC structure. From the perspective of processing module 104, processing module 104 cannot distinguish signal $S_{13}$ from a $4^{th}$ order sigma delta ADC structure, i.e. signal $S_{13}$ is substantially the same as a $4^{th}$ order sigma delta ADC structure. Processing module 408 may perform any of various signal processing functions on signal $S_{13}$ depending upon the application desired.

Process of Emulating a Signal in the First Implementation

Figure 5:
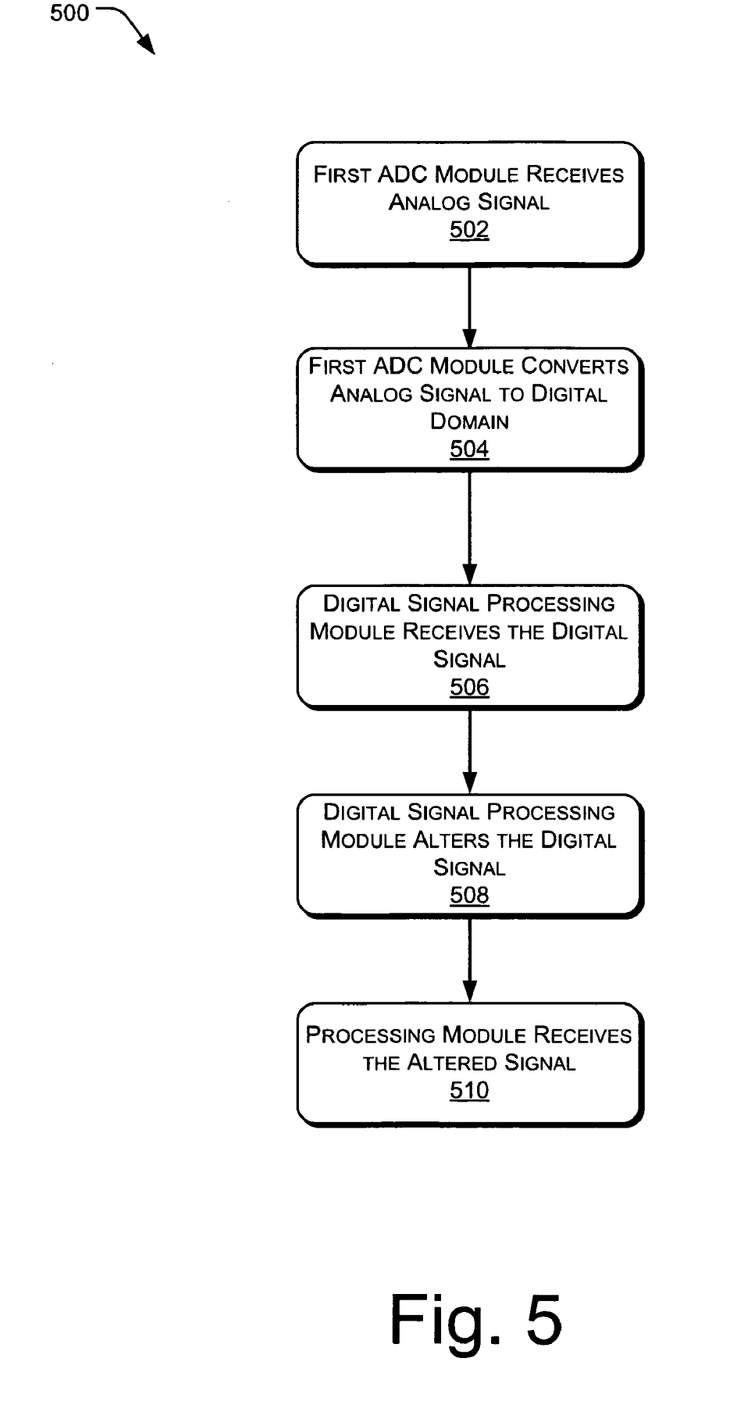
FIG. 5 is a flowchart of employing the system of FIG. 2.

FIG. 5 shows a method 500 of employing system 200. The process 500 is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in other orders and/or in parallel to implement the process.

At step 502, ADC module 202 receives input signal $S_3$.

At step 504, ADC module 202 converts signal $S_3$ from the analog domain to the digital domain and outputs signal $S_4$.

At step 506, digital signal processing module 206 receives signal $S_4$.

At step 508, digital signal processing module 306 alters signal $S_4$ by employing such techniques including, but not limited to, filtering, re-quantizing, and up- or down-sampling signal $S_4$ and outputting signal $S_5$.

At step 510, processing module 104 receives signal $S_5$, with signal $S_5$ emulated as a desired signal.

Process of Emulating a Signal in the Second Implementation

Figure 6:
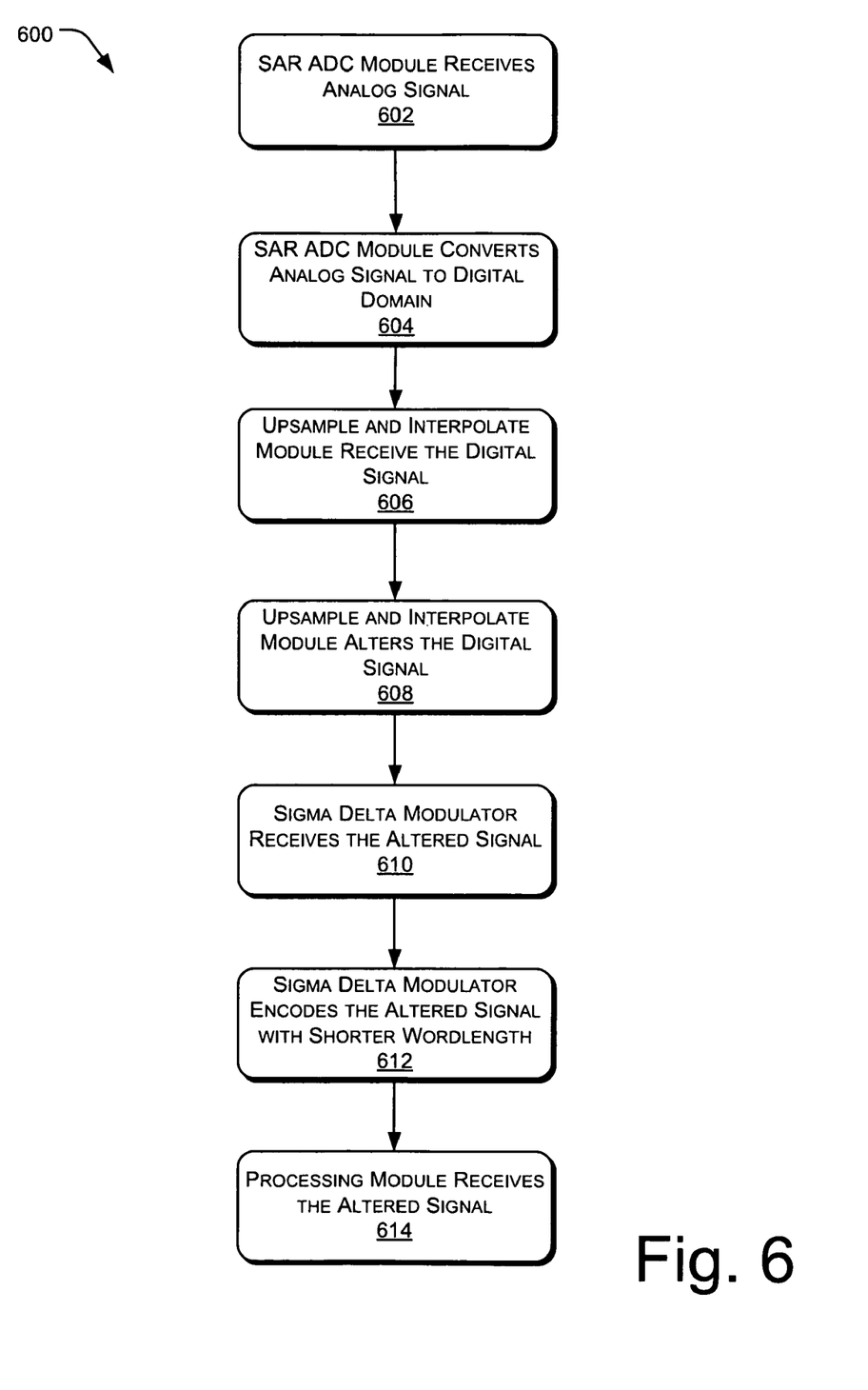
FIG. 6 is a flowchart of employing the system of FIG. 3.

FIG. 6 shows a method 600 of employing system 300. The process 600 is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in other orders and/or in parallel to implement the process.

At step 602, SAR ADC module 302 receives input signal $S_6$.

At step 604, SAR ADC module 302 converts signal $S_6$ from the analog domain to the digital domain and outputs digital signal $S_7$.

At step 606, upsample and interpolate module 306 receives signal $S_7$.

At step 608, upsample and interpolate module 306 alters signal $S_7$ by increasing a frequency of signal $S_7$ e.g. by but not limited to bit stuffing and performs digital interpolation on signal $S_7$, e.g. but not limited to by using a sinc filter, finally outputting signal $S_8$.

At step 610, sigma delta modulator module 308 receives signal $S_8$.

At step 612, sigma delta modulator module 308 encodes signal $S_8$ into a differently coded signal, e.g. using a code with fewer bits, and outputs this as signal $S_9$.

At step 614, processing module 104 receives signal $S_9$, with signal $S_9$ emulated as a desired signal.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A system comprising:
   a first analog to digital converter (ADC) to receive an analog signal and convert the analog signal to a first digital signal; and
   a digital processing module to receive the first digital signal and alter the digital signal to define an altered digital signal such that the altered digital signal emulates a second digital signal that is characteristic of a second ADC, the second ADC differing from the first ADC.

2. The system as recited in claim 1 wherein the first ADC is a successive-approximation-register analog to digital converter.

3. The system as recited in claim 1 wherein the first ADC is a sigma delta analog to digital converter.

4. The system as recited in claim 1 wherein the digital processing module comprises a digital sigma delta modulator module.

5. The system as recited in claim 4 wherein the digital sigma delta modulator module is of $4^{th}$ order with a single bit output stream.

6. The system as recited in claim 1 wherein the digital processing module comprises also a sample rate conversion module.

7. The system as recited in claim 1 wherein the analog signal is input from a sensor.

8. The system as recited in claim 7 wherein the analog signal is input from a microphone.

9. The system as recited in claim 1 wherein the altered digital signal is coded with fewer bits than the first digital signal.

10. The system as recited in claim 1 wherein the altered digital signal is coded with more bits than the first digital signal.

11. The system as recited in claim 1 wherein the altered digital signal has a lower data rate than the first digital signal.

12. The system as recited in claim 1 wherein the altered digital signal has a higher data rate than the first digital signal.

13. The system as recited in claim 1 implemented in a mobile communications device.

14. The system as recited in claim 1 implemented in a hearing aid device.

15. The system as recited in claim implemented in a hands free mobile communications device.

16. A method comprising:
    converting an analog input signal to a first digital signal by a first analog to digital converter (ADC); and
    altering the first digital signal to define an altered digital signal such that the altered digital signal emulates a second digital signal that is characteristic of a second ADC, the second ADC differing from the first ADC.

17. The method as recited in claim 16 wherein altering further comprises the altered digital signal having characteristics that are substantially the same as characteristics of the second digital signal.

18. The method as recited in claim 17 further comprising transmitting the digital signal to a digital signal processing module to alter the first digital signal.

19. The method as recited in claim 18 wherein altering further comprises increasing or decreasing a frequency of the first digital signal.

20. The method as recited in claim 19 wherein altering further comprises interpolating or decimating the first digital signal.

21. The method as recited in claim 20 wherein altering further comprises encoding the altered digital signal with fewer bits or more bits than the first digital signal.

22. The method as recited in claim 21 wherein the altered signal is coded with a 1 bit stream.

23. The method as recited in claim 22 wherein altering further comprises employing techniques on the digital signal selected from a group of techniques comprising filtering, re-quantizing, and up- or down-sampling.

24. A system comprising:
    a successive approximation (SAR) analog to digital converter (ADC) receiving an analog signal and converting the analog signal to a first digital signal;
    an upsample and interpolate module receiving the first digital signal and increasing a frequency of and interpolating the first digital signal to define a second digital signal;
    a sigma delta modulator module receiving the second digital signal and encoding the second digital signal with a shorter wordlength to define a third digital signal; and
    wherein the third digital signal emulates a fourth digital signal that is characteristic of a $4^{th}$ order sigma delta ADC.

* * * * *